(12) United States Patent
Hsieh et al.

(10) Patent No.: US 6,998,315 B2
(45) Date of Patent: Feb. 14, 2006

(54) TERMINATION STRUCTURE FOR TRENCH DMOS DEVICE AND METHOD OF MAKING THE SAME

(75) Inventors: Hsin-Huang Hsieh, Hsinchu (TW); Chiao-Shun Chuang, Hsinchu (TW); Su-Wen Chang, Hsinchu (TW); Mao-Song Tseng, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 11/056,450

(22) Filed: Feb. 11, 2005

(65) Prior Publication Data

US 2005/0199952 A1 Sep. 15, 2005

Related U.S. Application Data

(62) Division of application No. 10/652,442, filed on Aug. 28, 2003, now Pat. No. 6,855,986.

(30) Foreign Application Priority Data

May 6, 2003 (TW) .................................. 92112321 A

(51) Int. Cl.
*H01L 21/336* (2006.01)
(52) U.S. Cl. ...................... 438/270; 438/268; 438/272; 438/279
(58) Field of Classification Search ................ 438/268, 438/270, 272, 279, 259, 283; 257/E29.027, 257/E21.655
See application file for complete search history.

(56) References Cited

U.S. PATENT DOCUMENTS

| 5,814,895 A | 9/1998 | Hirayama |
| 5,905,283 A | 5/1999 | Kasai |
| 6,309,929 B1 | 10/2001 | Hsu et al. |
| 2003/0127702 A1 | 7/2003 | Blair et al. |

*Primary Examiner*—Tom Thomas
*Assistant Examiner*—Matthew C Landau
(74) *Attorney, Agent, or Firm*—Townsend and Townsend and Crew LLP

(57) ABSTRACT

Embodiments of the present invention are directed to a termination structure provided for a trench DMOS device to reduce occurrence of current leakage resulting from electric field crowding at the border of the active area and a method of manufacturing the same. In one embodiment, the termination structure for the trench DMOS device comprises a substrate of a first type conductivity and an epitaxial layer of the first type conductivity over the substrate. The epitaxial layer has a lower doping concentration than the substrate. A body region of a second type conductivity is provided within the epitaxial layer. A trench extends through the body region between an active area and an edge of the substrate. A gate oxide layer lines the trench and extends to the upper surface of the body region between the trench and the active area. A passivation layer is formed on the gate oxide layer, including sidewalls and a bottom surface of the trench. A metal layer covers portions of the passivation layer on the side walls of the trench to expose a part of the passivation layer over the bottom surface of the trench.

11 Claims, 9 Drawing Sheets

TERMINATION STRUCTURE FOR TRENCH DMOS DEVICE AND METHOD OF MAKING THE SAME

This application is a divisional of U.S. patent application Ser. No. 10/652,442, filed Aug. 28, 2003, now U.S. Pat. No. 6,855,986.

CROSS-REFERENCES TO RELATED APPLICATIONS

This application claims priority from R.O.C. Patent Application No. 092112321, filed May 6, 2003, the entire disclosure of which is incorporated herein by reference.

BACKGROUND OF THE INVENTION

The present invention relates to a termination structure provided for a trench DMOS device, and more particularly, to a termination structure provided for a trench DMOS device to reduce occurrence of current leakage and to prevent premature phenomena of voltage breakdown resulting from electric field crowding at the border of the active area and a method of manufacturing the same.

A DMOS (Double diffused MOS) transistor is a type of MOSFET (Metal Oxide Semiconductor Field Effect Transistor) that uses diffusion to form a transistor region. DMOS transistors are typically employed as power transistors for high voltage power integrated circuits.

One particular type of DMOS transistor is a so-called trench DMOS transistor. In this kind of trench MOSFET devices, the channels are arranged in a vertical manner, instead of horizontally as in most planar configurations. FIG. 1 shows a cross-sectional view of a conventional trenched gate MOSFET device 10. The trenched gate MOSFET device 10 includes a trench 12 filled with conductive material 14 separated from the silicon regions 16 by a thin layer of insulating material 18. A body region 20 is diffused in an epitaxial layer 22, and a source region 24 is in turn diffused in the body region 20. Due to the use of these two diffusion steps, a transistor of this type is frequently referred to as a double-diffused metal oxide semiconductor field effect transistor with trench gating or, in brief, a "trench DMOS." As arranged, the conductive and insulating materials 14 and 18 in the trench 12 form the gate 26 and gate oxide layer 28, respectively, of the trench DMOS.

Aside from a design of active area for carrying large current, it is also required for power transistors to create a termination structure in the periphery of the active region (i.e., at the edge of a die) to prevent premature phenomena of voltage breakdown.

Referring to FIG. 2, a termination structure provided for a trench DMOS device is shown. An N-type epitaxial layer 52 is provided on an N+ substrate 50. The N+ substrate 50 is typically a silicon substrate as well as the N-type epitaxial layer 52.

Trenches 56 formed within the N-type epitaxial layer 52 are lined with a gate oxide layer 58 and filled with polysilicon. The polysilicon in the trenches 56 is defined as gate electrodes 60. Within the N-type epitaxial layer 52 are P− body regions 54. P− body regions 54 in an active area (i.e., between adjacent trenches 56) are referred to herein "active area P body regions", while P body regions in a termination area (i.e., adjacent to and outside of a trench 56 on the periphery) are referred to as "termination P body regions." A "peripheral trench" refers to a trench 56, or a portion thereof, which is formed in a surface and is flanked on one side, but not the other, by one or more similar structures.

The edge of the trench DMOS device is a field oxide region 62 formed by the conventional method, wherein the thickness thereof is about 4,000 to 10,000 angstroms, preferably about 60,000 angstroms. The field oxide region 62 insulates portions of upper surfaces of the N-type epitaxial layer 52 and the termination P body regions.

The trench DMOS device of FIG. 2 also includes a plurality of N+ doped regions 64 and P+ contact regions 66, which extend to a depth of about 1.5 to 4.0 microns, preferably about 2.5 microns, within the P− body regions 54. The N+ doped regions 64 are abutting to side walls of the trenches 56 and upper surfaces of the P− body regions 54 in the active area. Between two of the adjacent N+ doped regions 64 being sandwiched a P+ contact region 66, thereby the P+ contact region 66 is abutting to upper surface of the P− body region 54 as well. Furthermore, another P+ contact region 66 is formed within the P− body region 54 between the peripheral trench and the field oxide region 62 (i.e., the termination area).

A plurality of passivation regions 68 (e.g., BPSG layer) principally cover the polysilicon so as to prevent the gate electrodes 60 from being shorted to the N+ doped regions 64. A conductive (e.g., metal) material 70 contacts and grounds the P− body region 54.

A method for manufacturing the trench DMOS device and the termination structure provided therefor is now described in detail. Referring to FIG. 3A, an N-type epitaxial layer 52 is initially grown on an N+ doped substrate 50. Next, an initial oxide layer 61 is grown on the epitaxial layer 52 to a thickness of about 150 to 500 angstroms, preferably about 200 angstroms. A first photoresist layer 72 is then coated on the structure and a first mask (not shown) is used to define patterns of the first photoresist layer 72. Subsequently, the initial oxide layer 61 where not covered by the patterned first photoresist layer 72 is removed by an etching procedure. The remaining first photoresist layer 72 is stripped from the initial oxide layer 61. Then, the initial oxide layer 61 is oxidized to form a field oxide structure 62 over the edge of the substrate 50. The epitaxial layer 52 not covered by the field oxide structure 62 is implanted and diffused to form a P− body region 54 therein. The resulting structure is shown in FIG. 3B.

Referring to FIG. 3C, a second photoresist layer 74 is coated on the structure of FIG. 3B. Next, a second mask (not shown) is used to define patterns of the second photoresist layer 74. A plurality of trenches 56 are formed through the P− body region 54 by using the patterned second photoresist layer 74 as an etching mask. Thereafter, the second photoresist layer 74 is removed. As will be appreciated more fully below, a depth of the trenches 56 is substantially greater than that of the P− body region 54. The resulting structure is shown in FIG. 3D.

Referring to FIG. 3E, a gate oxide layer 58 is attached on the structure of FIG. 3D where not covered by the field oxide structure 62. Subsequently, a polysilicon layer 60 is deposited, typically by CVD, to cover the structure of FIG. 3E and to fill the trenches 56. Thereafter, a third photoresist layer (not shown) is coated on the polysilicon layer 60 and patterns thereof are defined by using a third mask (not shown). The polysilicon layer 60 is then etched through apertures in the third photoresist layer to optimize its thickness within the trenches 56. The resulting structure is shown in FIG. 3F.

Next, a portion of the structure between the peripheral trench and the edge of the substrate 50 (or die) is masked (not shown), and other portion of the structure in the active area is covered by a fourth photoresist layer (not shown). Next, a fourth mask (not shown) is used to define patterns of the fourth photoresist layer. The P– body region 54 where not covered by the patterned fourth photoresist layer is doped to form a plurality of N+ doped regions 64 therein (FIG. 3G). Thereafter, the masking layer and the fourth photoresist layer are removed. It is noted that the N+ doped regions 64 are formed, by implantation and diffusion, within the P– body region 54. The N+ doped regions 64 are abutting to upper surfaces of the P– body region 54 and side walls of the trenches 56 in the active area.

Referring to FIG. 3H, a passivation (e.g., BPSG) layer 68 is grown on the structure of FIG. 3G, upon which is coated a fifth photoresist layer (not shown). Thereafter, patterns of the fifth photoresist layer are defined by using a fifth mask (not shown). The passivation layer 68 is etched through apertures in patterned fifth photoresist layer to form contact holes 69 therein. The fifth photoresist layer is then removed and portions of the P– body region 54 exposed in the contact holes 69 are then doped to form P+ contact regions 66. A conductive layer 70 is formed on the structure and fills the contact holes 69. Next, a sixth photoresist layer (not shown) is coated on the conductive layer 70 and patterned by using a sixth mask (not shown). The conductive layer 70 is etched through the aperture in patterned sixth photoresist layer to expose a part of the passivation layer 68 over the field oxide structure 62. The conductive layer 70 is provided to contact and ground the P– body region 54.

Referring back to FIG. 2, the bird beak characteristic shown in the marked area 76 leads to occurrence of premature phenomena of voltage breakdown since the electric field crowds thereat. In addition, the patterned fourth photoresist layer for forming the N+ doped regions 64 easily peels off from the gate oxide layer 58 since the dimensions thereof are very small.

BRIEF SUMMARY OF THE INVENTION

Embodiments of the present invention are directed to a termination structure provided for a trench DMOS device to reduce occurrence of current leakage resulting from electric field crowding at the border of the active area and a method of manufacturing the same. The termination structure provided for the trench DMOS device prevents premature phenomena of voltage breakdown resulting from electric field crowding at the border of the active area.

In specific embodiments, a trench DMOS device and a termination structure provided therefor include a heavily doped n+ substrate, upon which is grown an n– epitaxial layer. Within the epi layer, a body region of opposite conductivity (p–) is provided. A plurality of first-type trenches through the body region in the active area are lined with gate oxide layer and filled with gate electrodes. A second-type trench through the body region is located between the active area and the edge of the substrate (or die) and lined with the gate oxide layer. The width of the second-type trench is greater then that of the first-type trench. The gate oxide layer attached on the surfaces of the first-type and second-type trenches is extended to upper surfaces of the body region. A plurality of contact holes are formed in the body region between the first-type trenches, and exposed body region within the contact holes are doped to form P+ contact regions. A plurality of doped regions (n+) formed in the body region are sandwiched between the contact hole and the first-type trench. A passivation layer is formed on the gate oxide layer and covers the gate electrode.

A metal layer is provided to cover the passivation layer and fill the contact holes and the second-type trench. An opening is located in the metal layer to expose a portion of bottom surface of the second-type trench, wherein parts of the gate oxide layer laminated on side walls of the second-type trench are completely covered by the metal layer.

Another aspect of the present invention relates to a method of manufacturing a trench DMOS device and a termination structure provided therefor. An n– epitaxial layer is formed on a heavily doped n+ substrate. Next, a body region of opposite conductivity (p–) is formed within the epi layer. The procedure of etching is then carried out to form a plurality of first-type trenches and a second-type trench through the body region, wherein the second-type trench has a greater width than the first-type trench. The first-type trenches are formed through the body region in the active area, whereas the second-type trench is formed through the body region between the active area and the edge of the substrate (or die). Thereafter, a gate oxide layer is deposited on the body region and attached on the first-type and second-type trenches. The first-type trenches lined with the gate oxide layer are filled with polysilicon gate electrode. Next, portions of the body region located between the first-type trenches are doped with n+ type dopant to form a plurality of doped regions therein. A passivation layer is then formed on the gate oxide layer and covers the polysilicon electrodes. Subsequently, plural contact holes are formed through the doped regions. The exposed body regions within the contact holes are doped to form P+ contact regions. A metal layer is provided on the passivation layer and to fill the second-type trench and the contact holes. An opening is formed in the metal layer to expose a portion of the passivation layer over bottom surface of the second-type trench, wherein parts of the passivation layer on side walls of the second-type trench are completely covered by the metal layer.

DETAILED DESCRIPTION OF THE INVENTION

The invention discloses a trench DMOS device and a termination structure provided therefor and a method of manufacturing the same. The exemplary embodiment of the present invention is now described in detail below.

Figure 1:
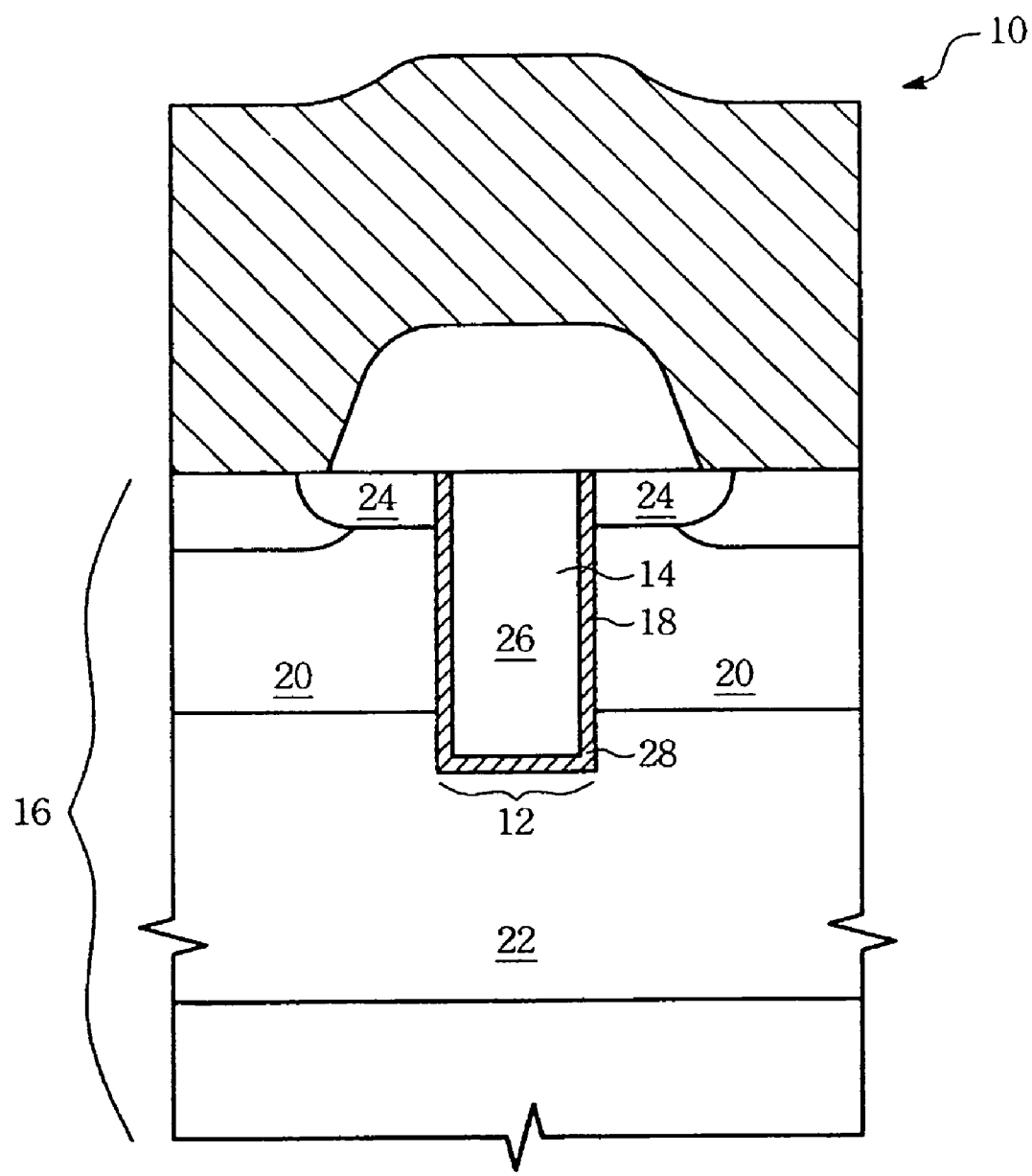
FIG. 1 is a sectional view of a trench MOSFET device in accordance with the prior art.
Figure 2:
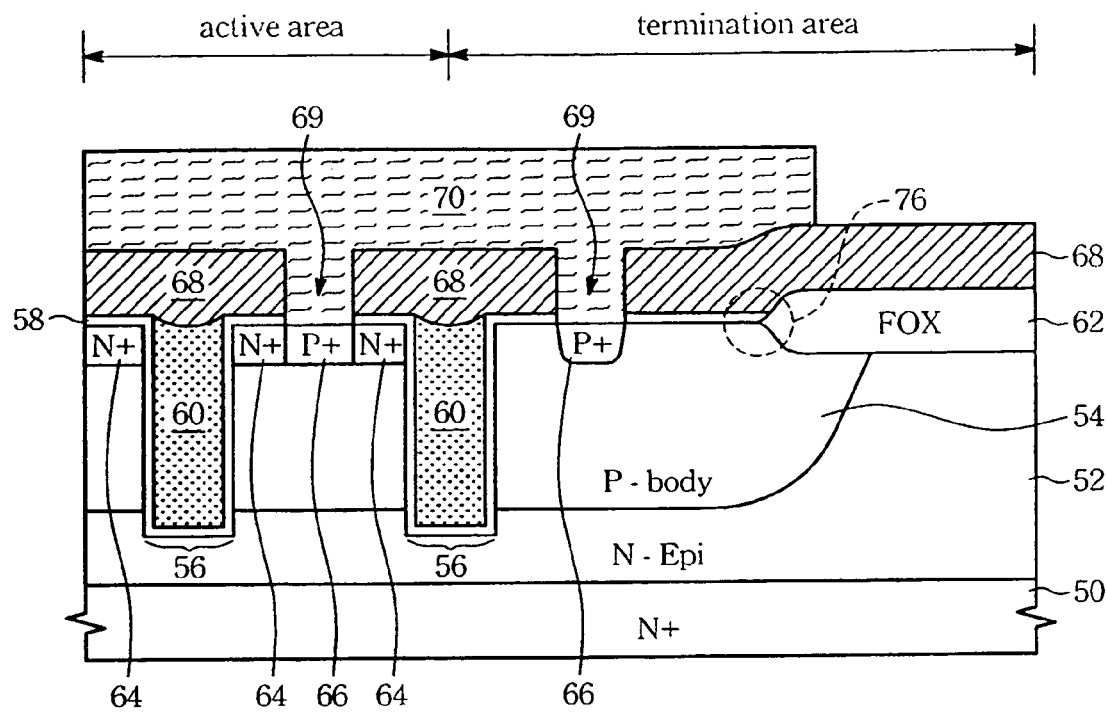
FIG. 2 is a sectional view of a trench MOSFET device and a termination structure provided therefor in accordance with the prior art.
Figure 3A:
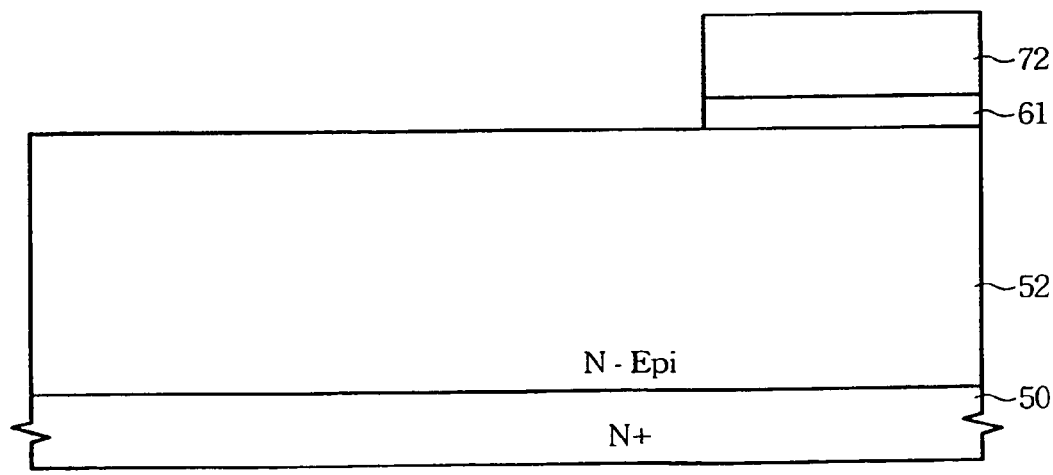
FIGS. 3A–3H show a method of manufacturing a trench MOSFET device in accordance with the prior art.
Figure 3B:
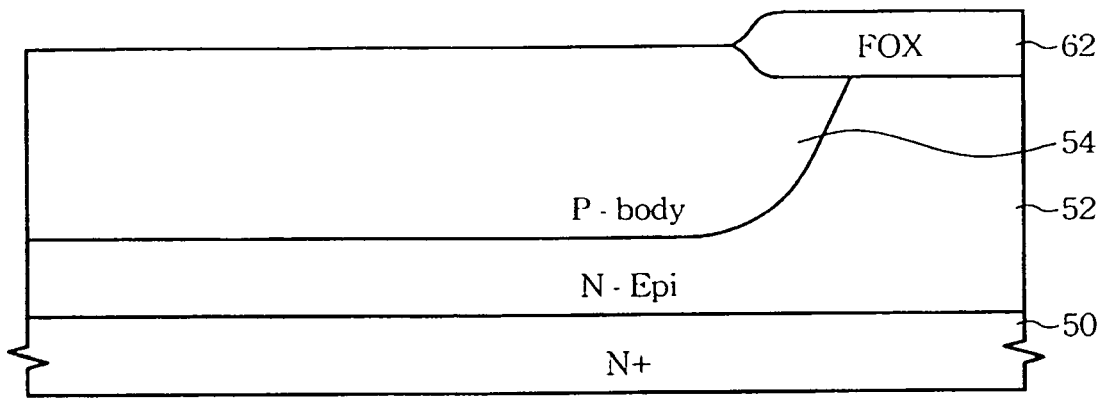
Figure 3C:
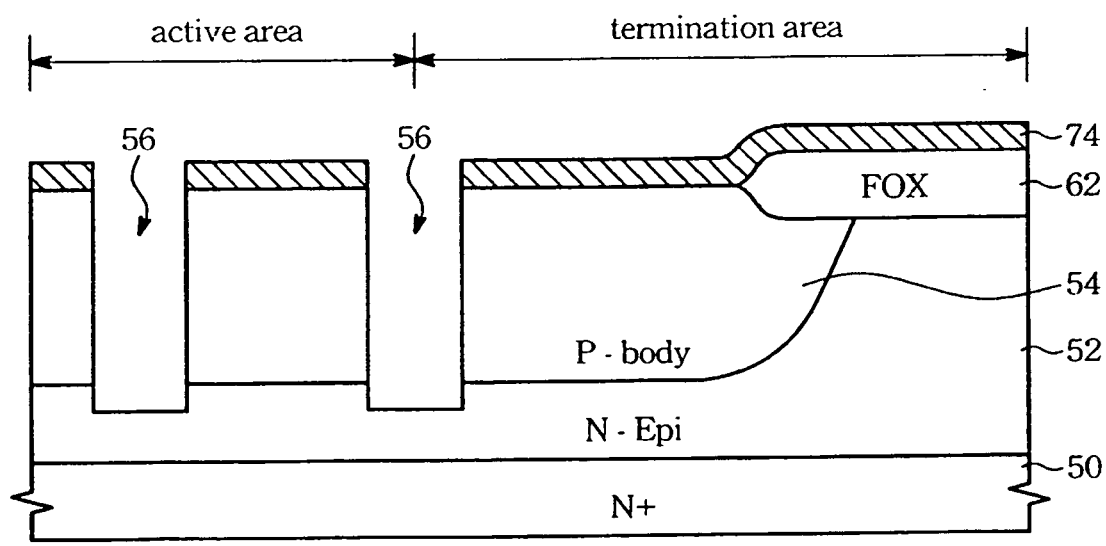
Figure 3D:
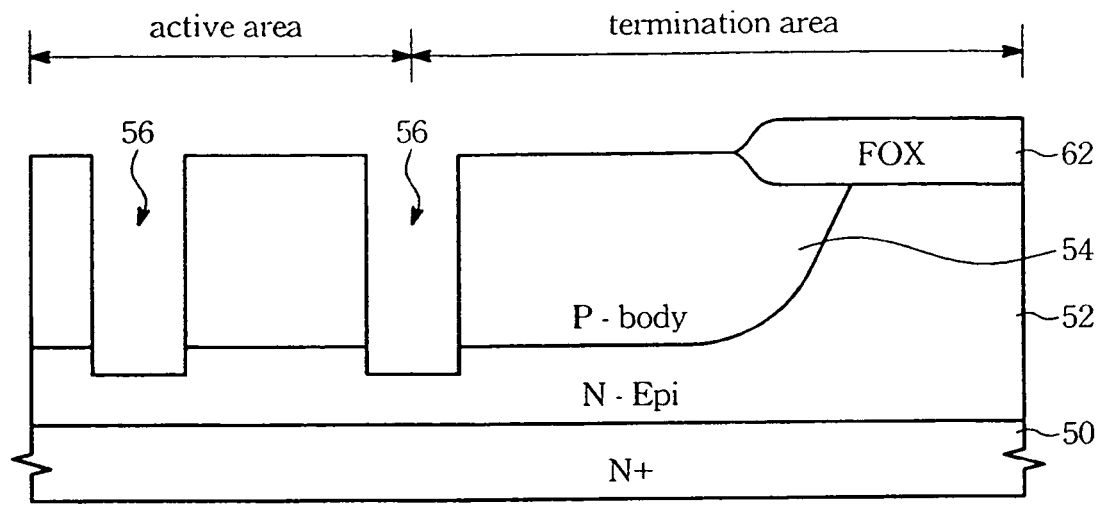
Figure 3E:
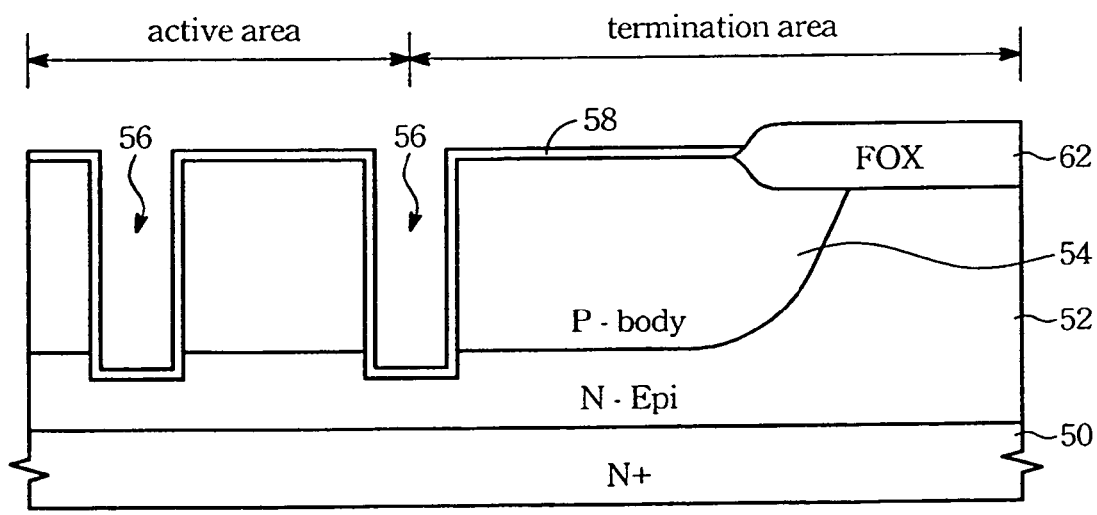
Figure 3F:
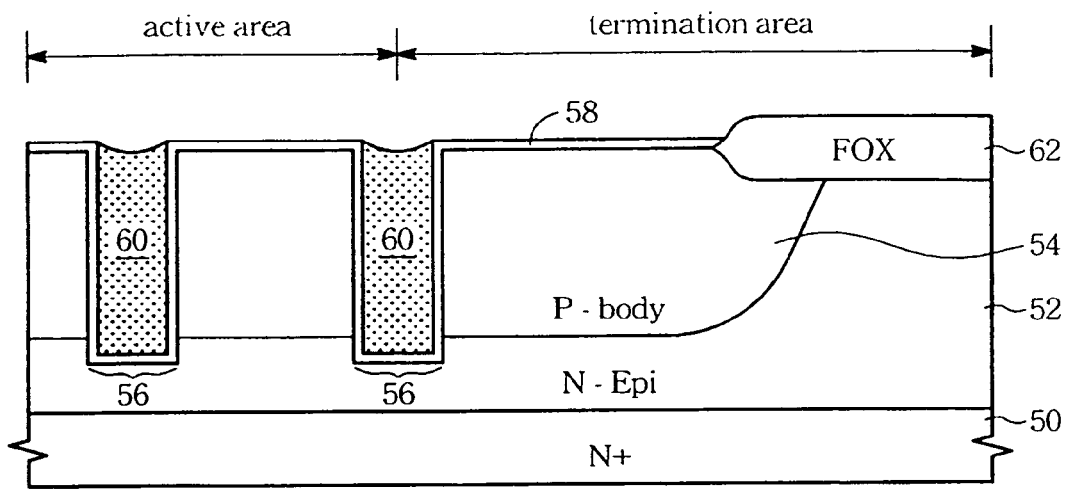
Figure 3G:
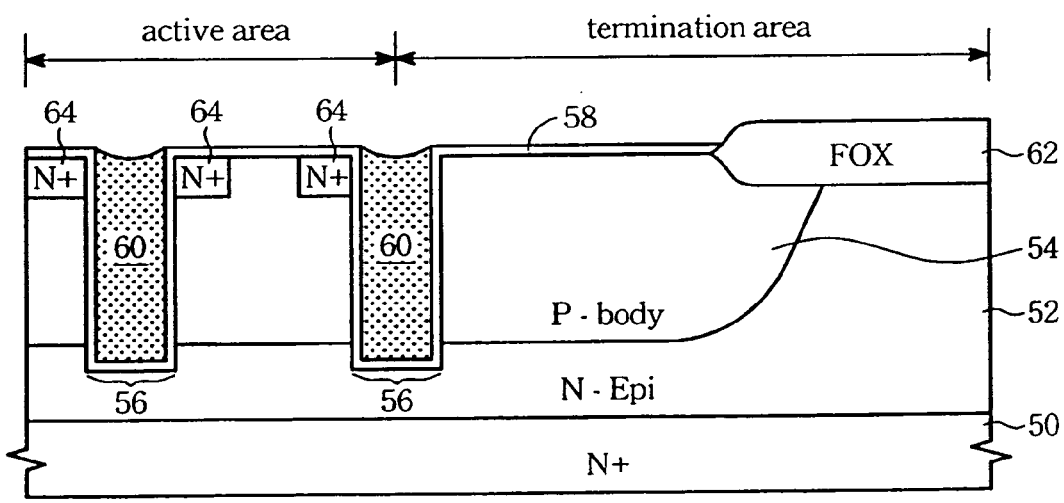
Figure 3H:
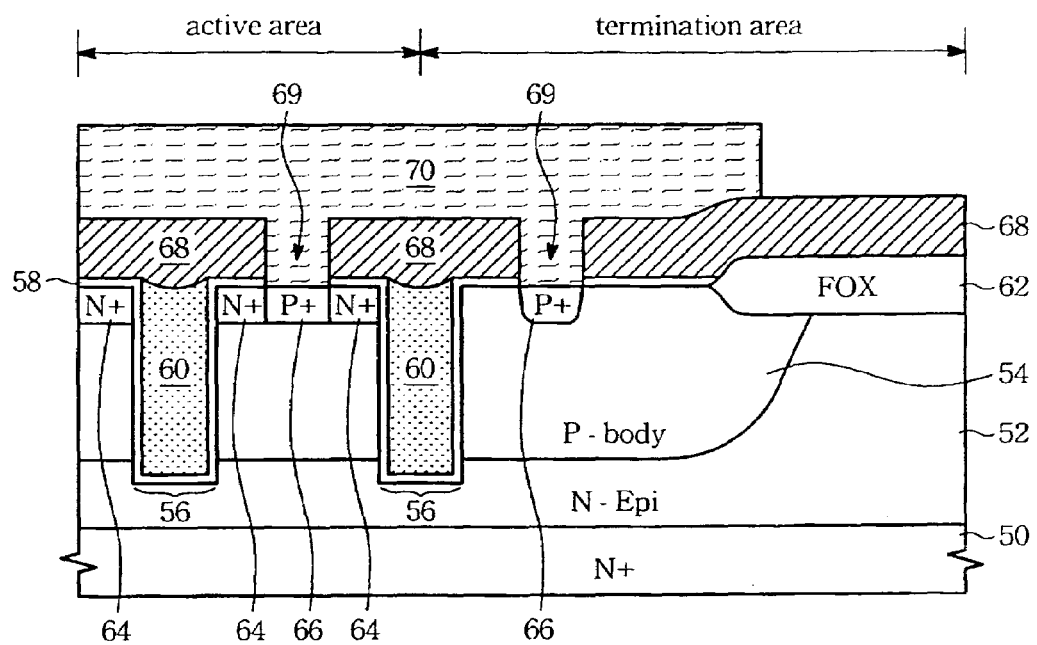
Figure 4:
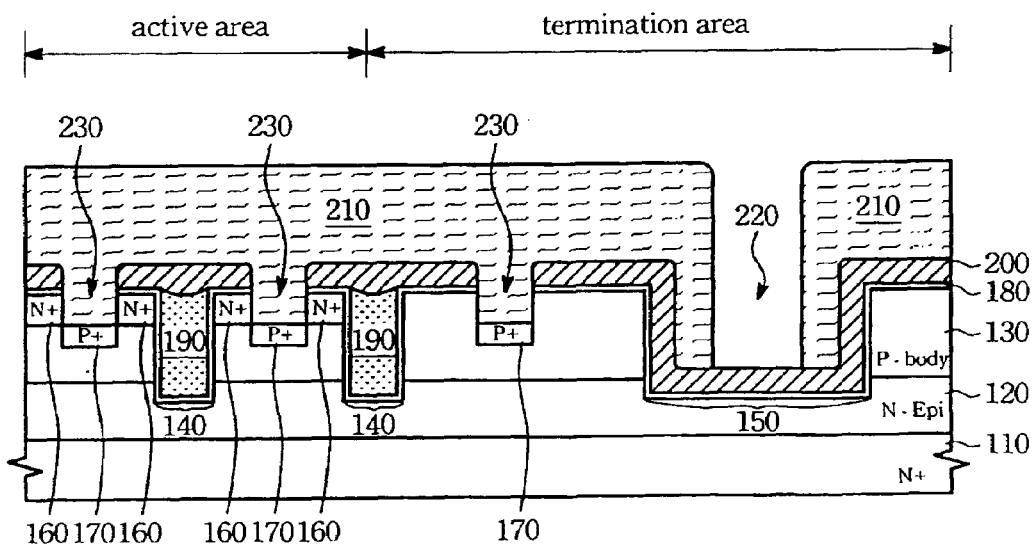
FIG. 4 is a sectional view of a trench DMOS device and a termination structure provided therefor in accordance with an embodiment of the present invention.

Referring to FIG. 4, the trench DMOS device and the termination structure provided therefor include a heavily doped silicon substrate 110 of N+ type conductivity, upon which is grown a lightly doped epitaxial layer 120 of N– type conductivity. A body region 130 of P– type conductivity is provided within the epi layer 120.

A plurality of first-type trenches 140 through the body region 130 in the active area have a depth greater than the body region 130. A second-type trench 150 through the body region 130 is located between the active area and an edge of the substrate 110 (or die). The width of the second-type trench 150 is larger than that of the first-type trench 140. In addition, the second-type trench 150 has a depth greater than that of the body region 130 as well as the first-type trench 140. In one preferred embodiment of the present invention, the depth of the body region 130 ranges from about 1.2 to 2.0 microns, preferably about 1.6 microns. The first-type trenches 140 and the second-type trench 150 have a depth of about 1.5 to 2.5 microns, preferably about 2.0 microns. The width of the first-type trench 140 ranges from about 0.3 to 1.0 micron, and the second-type trench 150 has a width of about 5 to 60 microns. Referring to FIG. 4, a "peripheral trench" refers to a first-type trench 140, or a portion thereof, which is formed through the body region 130 and is flanked on one side, but not the other, by one or more similar structures. The distance between the peripheral trench and the second-type trench 150 ranges from about 5 to 60 microns, preferably about 40 microns. It is noted that the second-type trench 150 is provided for the termination structure as mentioned above.

A plurality of contact holes 230 in the body region 130 are located between adjacent first-type trenches 140 and, the peripheral trench and the second-type trench 150. The depth of the contact holes 230 is smaller than that of the body region 130. Exposed surfaces of the body region 130 within the contact holes 230 are doped to form contact regions 170 of the second type conductivity (P+). Plural doped (N+) regions 160 in the body region 130 are sandwiched between the contact hole 230 and the first-type trench 140 in the active area.

Still referring to FIG. 4, a gate oxide layer 180 is formed on surfaces of the first-type trenches 140 and the second-type trench 150, and extended on the doped regions 160 and body region 130. The first-type trenches 140 lined with the gate oxide layer 180 are filled with polysilicon gate electrode 190. A passivation layer 200 is provided on the gate oxide layer 180 and covers the gate electrode 190. In one preferred embodiment of the present invention, the gate oxide layer 180 is made of silicon dioxide, and the passivation layer 200 comprises borophosphosilicate glass (BPSG). A metal layer 210 is provided to cover the passivation layer 200 and fill the second-type trench 150, which is lined with the gate oxide layer 180 and the passivation layer 200, and the contact holes 230. An opening 220 is formed in the metal layer 210 to expose a part of the passivation layer 200 on the bottom surface of the second-type trench 150. It is noted that portions of the passivation layer 200 on side walls of the second-type trench 150 are completely covered by the metal layer 210.

Figure 5A:
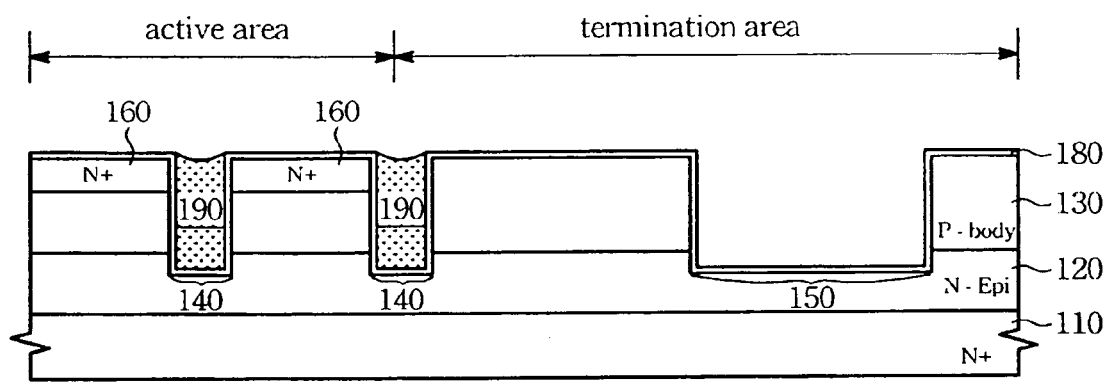
FIGS. 5A–5D show a method of manufacturing a trench DMOS device and a termination structure provided therefor in accordance with an embodiment of the present invention.

FIGS. 5A to 5D show a process of manufacturing the trench DMOS device and the termination structure provided therefor. Referring to FIG. 5A, an epitaxial layer 120 of N– type conductivity is initially grown on a substrate 110 of N+ type conductivity. Next, a body region 130 of P– type conductivity is formed in the epi layer 120 by implantation and diffusion. The body region 130 has a doping concentration of about 2.0E12 to 1.2E14, preferably about 7.0E13.

A first photoresist layer (not shown) is coated on the body region 130 and patterned by using a first mask (not shown). Thereafter, the patterned first photoresist layer is used to create a plurality of first-type trenches 140 and a second-type trench 150 through the body region 130. Still referring to FIG. 5A, the first-type trenches 140 and second-type trench 150 each have a greater depth than the body region 130. In addition, the width of the second-type trench 150 is larger than that of the first-type trenches 140. A "peripheral trench" refers to a first-type trench 140, or a portion thereof, which is formed through the body region 130 and is flanked on one side, but not the other, by one or more similar structures.

Subsequently, a gate oxide layer 180 of about 200 to 1000 angstroms in thickness is grown on the body region 130 and laminated on surfaces of the first-type trenches 140 and the second-type trench 150. In one preferred embodiment of the present invention, the gate oxide layer 180 is made of silicon dioxide. The surface of the structure is then covered, and the first-type trenches 140 and second-type trench 150 are filled, with a polysilicon layer, typically using CVD. Next, the polysilicon layer is etched to optimize its thickness within the first-type trenches 140. Because the width of the second-type trench 150 is much greater than that of the first-type trenches 140, the polysilicon layer within the second-type trench 150 is removed after performing the procedure of etching. Then, the structure between the peripheral trench and the edge of the substrate 110 (or die) is masked (not shown). A global implantation is applied to form doped regions 160 of N+ type conductivity within the body region 130 that is not masked. After that, the masking layer is removed.

Figure 5B:
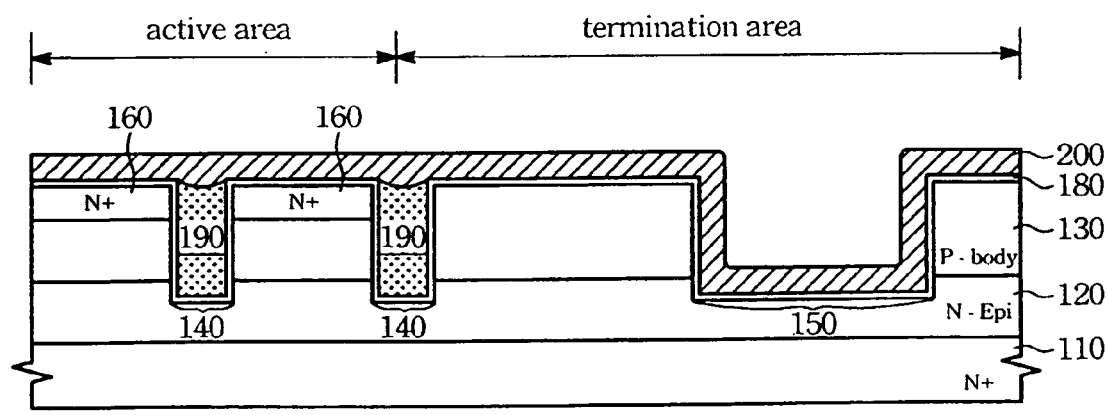
Figure 5C:
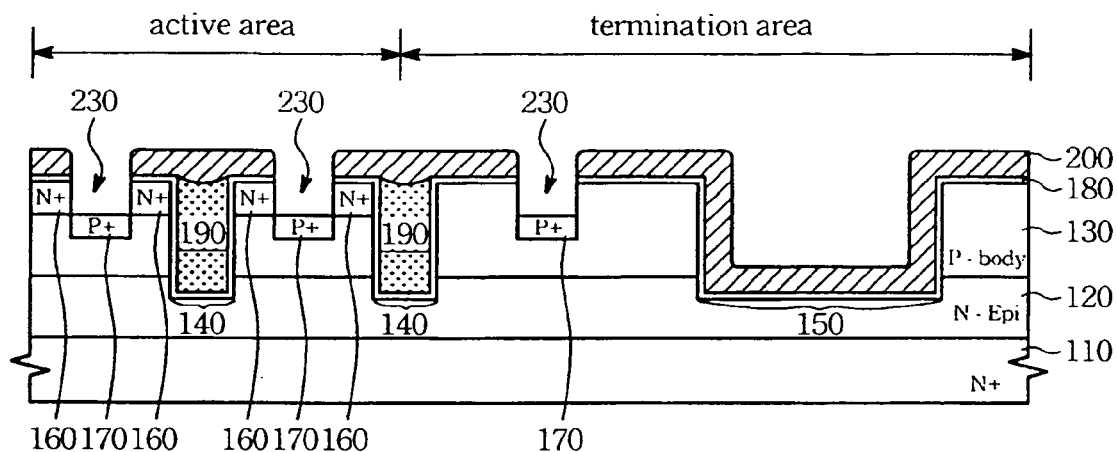

Referring to FIG. 5B, a passivation layer 200 with a thickness of about 0.2 to 1.0 microns, preferably about 0.75 microns, is grown on the structure of FIG. 5A. In one preferred embodiment of the present invention, the passivation layer 200 comprises BPSG. Referring to FIG. 5C, a second photoresist layer (not shown) is coated on the structure of FIG. 5B and is patterned by using a second mask (not shown). The passivation layer 200, gate oxide layer 180, and body region 130 are etched in turn through apertures in the second photoresist layer to form a plurality of contact holes 230 between the first-type trenches 140. In one preferred embodiment of the present invention, the contact holes 230 have a depth of about 0.12 to 0.3 micron, preferably about 0.18 micron. Thereafter, the second photoresist layer is removed and the exposed surfaces of the body region 130 within the contact holes 230 are doped to form a plurality of contact regions 170 of P+ type conductivity. The doping concentration of the contact regions 170 is typically about 1E16.

Figure 5D:
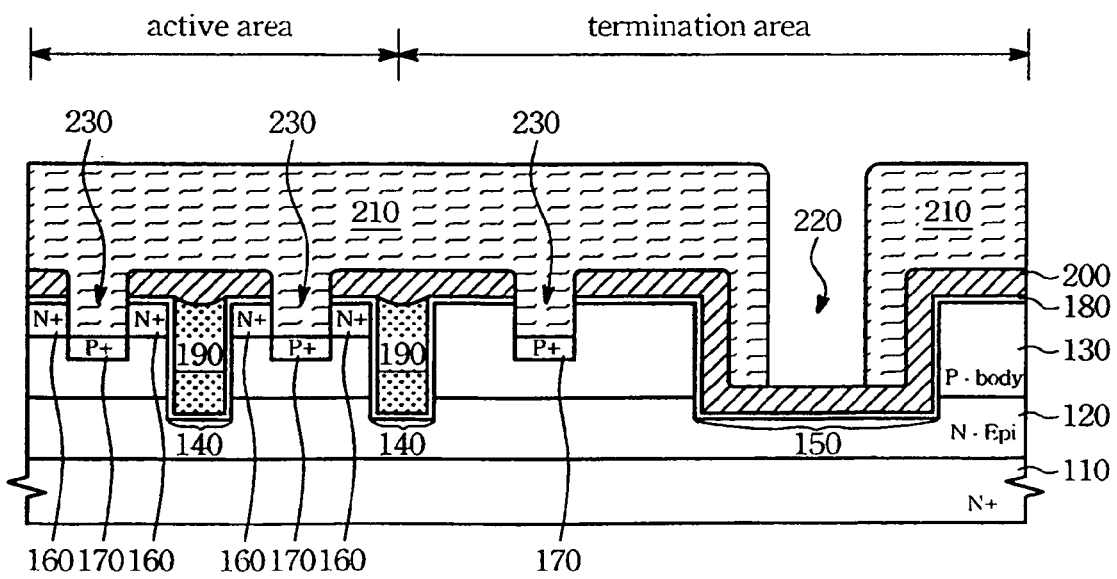

Referring to FIG. 5D, a conductive layer 210 of about 1.5 to 4.0 microns thick, preferably about 3.0 microns thick, is formed on the structure of FIG. 5C and fills the second-type trench 150, which is lined with the gate oxide layer 180 and passivation layer 200, and the contact holes 230. The metal layer 210 is provided in connection with the body region 130 and doped regions 160. In the embodiment of the present invention, the metal layer 210 is typically provided to ground the body region 130 and doped regions 160. Next, a third photoresist layer (not shown) is coated on the metal layer 210 and patterned by using a third mask (not shown). The metal layer 210 is then etched through the aperture in the patterned photoresist layer to form an opening 220 within the second-type trench 150. It is noted that a portion of the passivation layer 200 on the bottom surface of the second-type trench 150 is exposed. In addition, parts of the passivation layer 200 on side walls of the second-type trench 150 are completely covered by the metal layer 210.

In the prior art, the width of the P+ contact regions is optimized, e.g., to greater than 0.5 microns, for the purpose of preventing the fourth photoresist layer from peeling off from the gate oxide layer. In the present invention, the doped regions 160 are formed by the global implantation, so the fourth photoresist layer necessary in the prior art is not used. Consequently, the integrity of the die is further improved.

Figure 6:
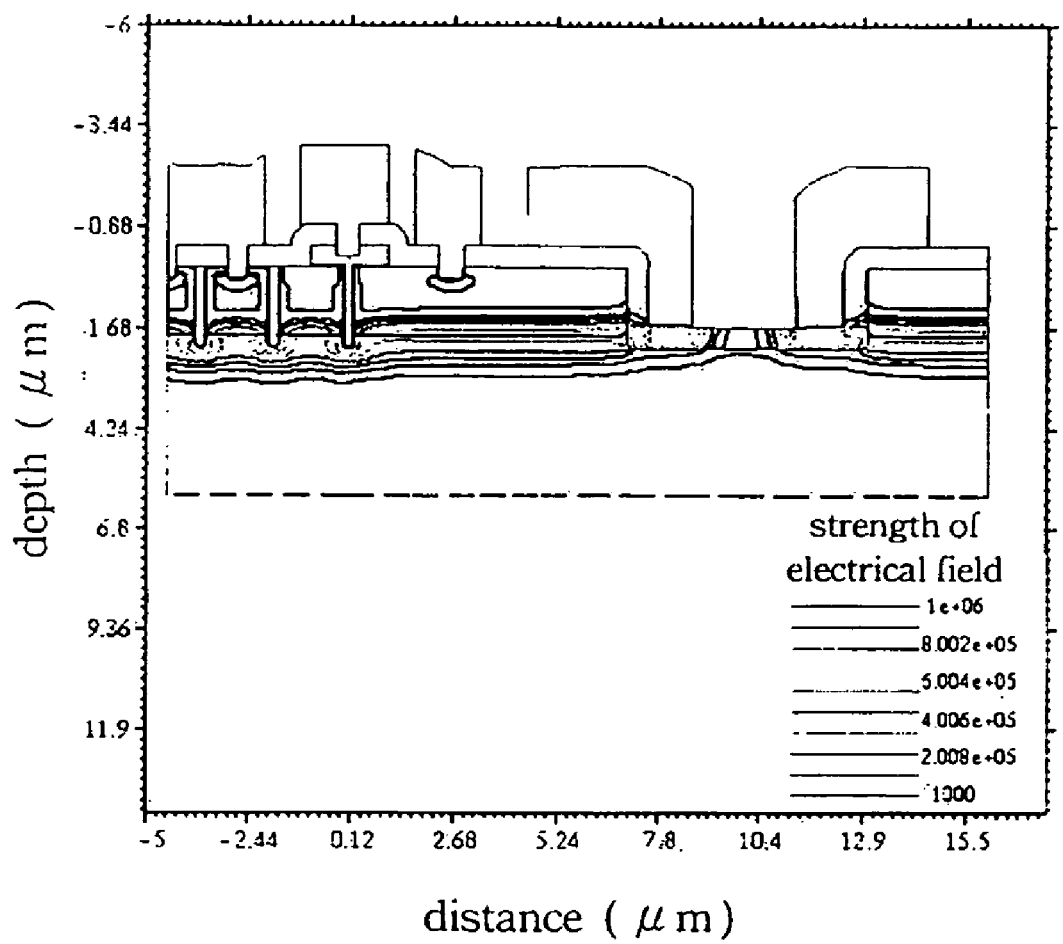
FIG. 6 shows the electrical field simulation of a trench DMOS device and a termination structure provided therefor in accordance with an embodiment of the present invention.

Referring to FIG. 6, the electrical field simulation of the trench DMOS device and the termination structure provided therefor is shown. The high density of the electrical field occurs in the passivation layer over the bottom surface of the second-type trench. In other words, the high density of the electrical field takes place in the region far away from the trench DMOS device. Hence, the premature phenomena of voltage breakdown is avoided.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a structure in which the conductivities of the various semiconductor regions are reversed from those described herein.

What is claimed is:

1. A method of simultaneously forming a trench DMOS device and a termination structure provided therefor, comprising:
    forming an epitaxial layer of a first type conductivity on a substrate of said first type conductivity, said epitaxial layer having a lower doping concentration that said substrate;
    forming a body region of a second type conductivity within said epitaxial layer;
    forming a plurality of first type trenches and a second type trench through said body region, said second type trench having a greater width than said first type trenches;
    growing a gate oxide layer for covering said body region and lining said first type trenches and said second type trench;
    filling said first type trenches with gate electrodes;
    forming a plurality of doped regions of said first type conductivity within said body region between said first type trenches;
    forming a passivation layer on said gate oxide layer and covering said gate electrodes;
    forming a plurality of contact holes between said first type trenches;
    forming a plurality of contact regions of a second type conductivity within exposed portions of said body region in said contact holes;
    forming a metal layer on said passivation layer and filling said contact holes and said second type trench; and
    forming an opening through said metal layer to expose a part of said passivation layer over a bottom surface of said second type trench, and portions of said passivation layer on side walls of said second type trench being covered by said metal layer.

2. The method of claim 1, wherein said first conductivity is N-type conductivity and said second type conductivity is P-type conductivity.

3. The method of claim 1, wherein said first conductivity is P-type conductivity and said second type conductivity is N-type conductivity.

4. The method of claim 1, wherein said body region has a depth of 1.2 to 2.0 microns.

5. The method of claim 1, wherein said contact holes has a depth of 0.12 to 0.3 micron.

6. The method of claim 1, wherein said first type trenches have a width of 0.3 to 1.0 micron and said second type trench has a width of 5 to 60 microns.

7. The method of claim 1, wherein forming the plurality of contact holes between said first type trenches comprises:
    forming a first photoresist layer on said passivation layer;
    patterning said first photoresist layer by performing a first photolithography process; and
    etching said passivation layer, said gate oxide layer and said body region in turn through apertures in said first photoresist layer to form the plurality of contact holes between said first type trenches.

8. The method of claim 1, wherein forming the opening through said metal layer comprises:
    forming a second photoresist layer on said metal layer;
    patterning said second photoresist layer by performing a second photolithography process; and
    etching said metal layer through apertures in said second photoresist layer to form the opening to expose a part of said passivation layer over the bottom surface of said second type trench, and portions of said passivation layer on side walls of said second type trench being completely covered by said metal layer.

9. The method of claim 1, wherein said plurality of first type trenches and said second type trench are formed simultaneously.

10. The method of claim 1, wherein said gate electrodes comprise polysilicon.

11. The method of claim 1, wherein said plurality of doped regions of said first type conductivity are formed by an implantation procedure.

* * * * *